(12) United States Patent
Park et al.

(10) Patent No.: US 8,471,748 B2
(45) Date of Patent: Jun. 25, 2013

(54) ANALOG-TO-DIGITAL CONVERTER WITH A RESOLUTION BOOSTER

(75) Inventors: Yunseo Park, Norcross, GA (US); Jaejoon Kim, Seoul (KR); Chang-Ho Lee, Marietta, GA (US)

(73) Assignee: Samsung Electro-Mechanics, Gyunngi-Do (KR)

( * ) Notice: Subject to any disclaimer, the term of this patent is extended or adjusted under 35 U.S.C. 154(b) by 106 days.

(21) Appl. No.: 13/104,810

(22) Filed: May 10, 2011

(65) Prior Publication Data

US 2012/0286980 A1    Nov. 15, 2012

(51) Int. Cl.
*H03M 1/14* (2006.01)

(52) U.S. Cl.
USPC .............................. 341/155; 341/163; 341/156

(58) Field of Classification Search
USPC .......................................... 341/156, 161, 172
See application file for complete search history.

(56) References Cited

U.S. PATENT DOCUMENTS

| 7,193,553 | B1 * | 3/2007 | Bahai | 341/161 |
| 2003/0058150 | A1 * | 3/2003 | Naka et al. | 341/161 |

OTHER PUBLICATIONS

Fang et al., CMOS 12 bits 50kS/s Micropower SAR and Dual-Slope Hybrid ADC, 52nd IEEE Midwest Symposium on International Circuits and Systems, 2009. MWSCAS '09, IEEE, Aug. 2009, pp. 180-183.*

\* cited by examiner

*Primary Examiner* — Howard Williams

(57) ABSTRACT

An analog-to-digital converter with a resolution booster is provided. The analog-to-digital converter may include a successive approximation analog-to-digital converter, a resolution booster, and an output combiner. The successive approximation analog-to-digital converter may be configured to convert an analog signal into digital data. The resolution booster may be selectively activated to enhance the resolution of the successive approximation analog-to-digital converter, and the output combiner may be configured to combine the respective outputs of the successive approximation analog-to-digital converter and the resolution booster.

16 Claims, 5 Drawing Sheets

ANALOG-TO-DIGITAL CONVERTER WITH A RESOLUTION BOOSTER

FIELD OF INVENTION

Embodiments of the invention relate generally to analog-to-digital converters, and more particularly, to analog-to-digital converters having a resolution booster that may be selectively activated.

BACKGROUND OF THE INVENTION

An analog-to-digital converter ("ADC") is often a critical component in the determination of overall performance for various digital electronic devices. Additionally, as more and more electronic products are being developed as hand-held devices, the power consumption of ADCs is often a critical design element for devices that utilize relatively low power. In conventional devices, the architecture of an ADC is typically determined by evaluating required power consumption, resolution, and sampling frequency parameters. For low-power performance, a successive-approximation type ADC is typically utilized.

However, if higher resolution performance is required, other type of ADCs, such as pipelined or sigma-delta ADCs, are often utilized. These higher resolution ADCs sacrifice low-power characteristics. Recently, significant research has been conducted in attempts to reduce the power consumption of higher resolution ADCs; however, acceptable power consumption levels for hand-held devices (e.g., µW-level power) have not been achieved. Accordingly, improved analog-to-digital converters are desirable.

BRIEF SUMMARY OF THE INVENTION

Embodiments of the invention are directed to analog-to-digital converters having a resolution booster. According to one example embodiment of the invention, there a dual mode analog-to-digital converter may be provided. The analog-to-digital converter may include a successive approximation analog-to-digital converter, a resolution booster, and an output combiner. The successive approximation analog-to-digital converter may be configured to convert an analog signal into digital data. The resolution booster may be selectively activated to enhance the resolution of the successive approximation analog-to-digital converter, and the output combiner may be configured to combine the respective outputs of the successive approximation analog-to-digital converter and the resolution booster.

According to another example embodiment, a method for a dual mode analog-to-digital converter may be provided. An analog signal may be provided to a successive approximation analog-to-digital converter, and the analog signal may be converted into digital data. A resolution booster may be selectively activated to enhance the resolution of the successive approximation analog-to-digital converter. The respective outputs of the successive approximation analog-to-digital converter and the resolution booster may be combined with an output combiner.

BRIEF DESCRIPTION OF THE DRAWINGS

Figure 1:
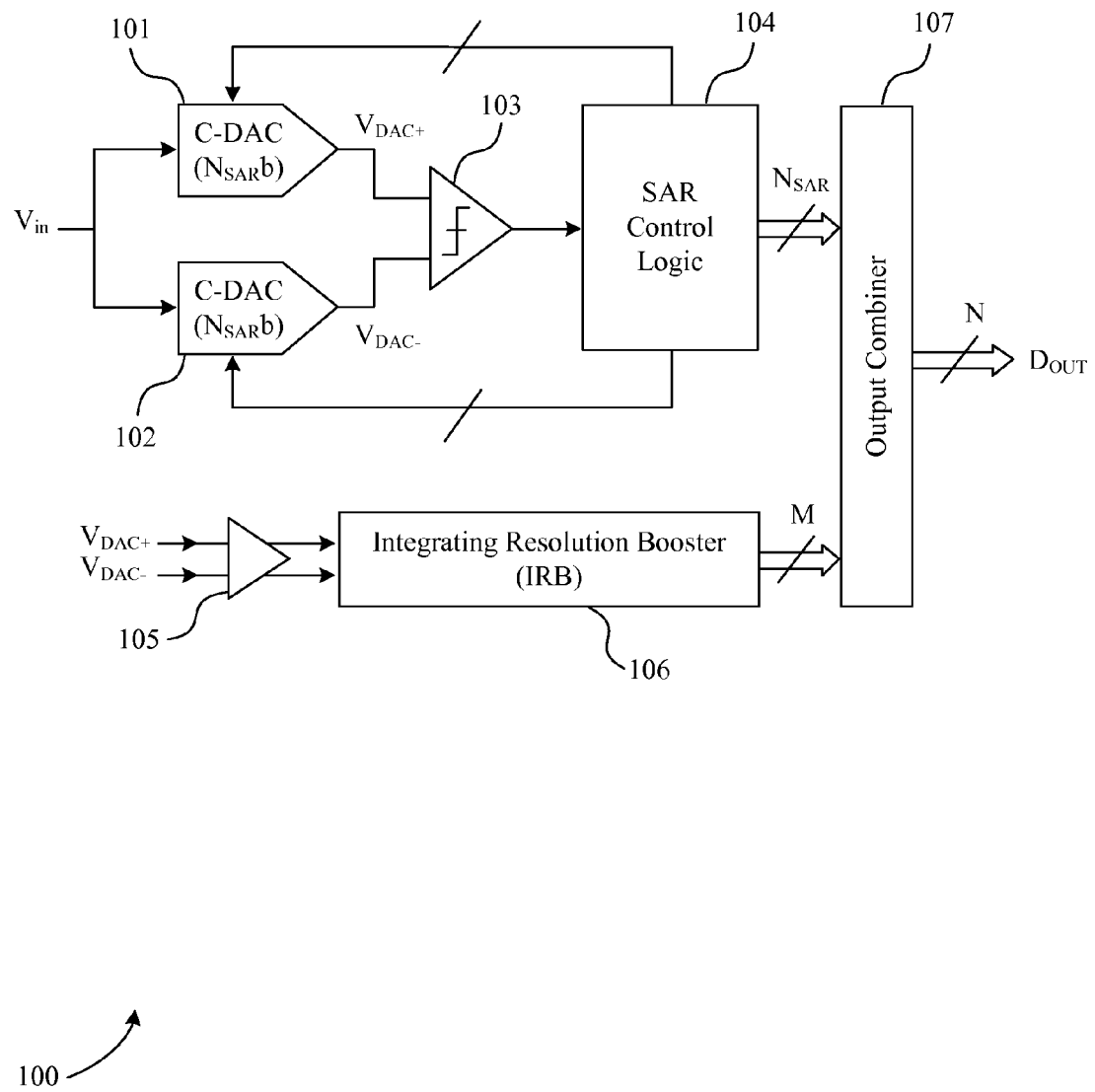

Having thus described the invention in general terms, reference will now be made to the accompanying drawings, which are not necessarily drawn to scale, and wherein:

FIG. 1 is a block diagram of a dual mode analog-to-digital converter, according to an illustrative embodiment of the invention.

Figure 2:
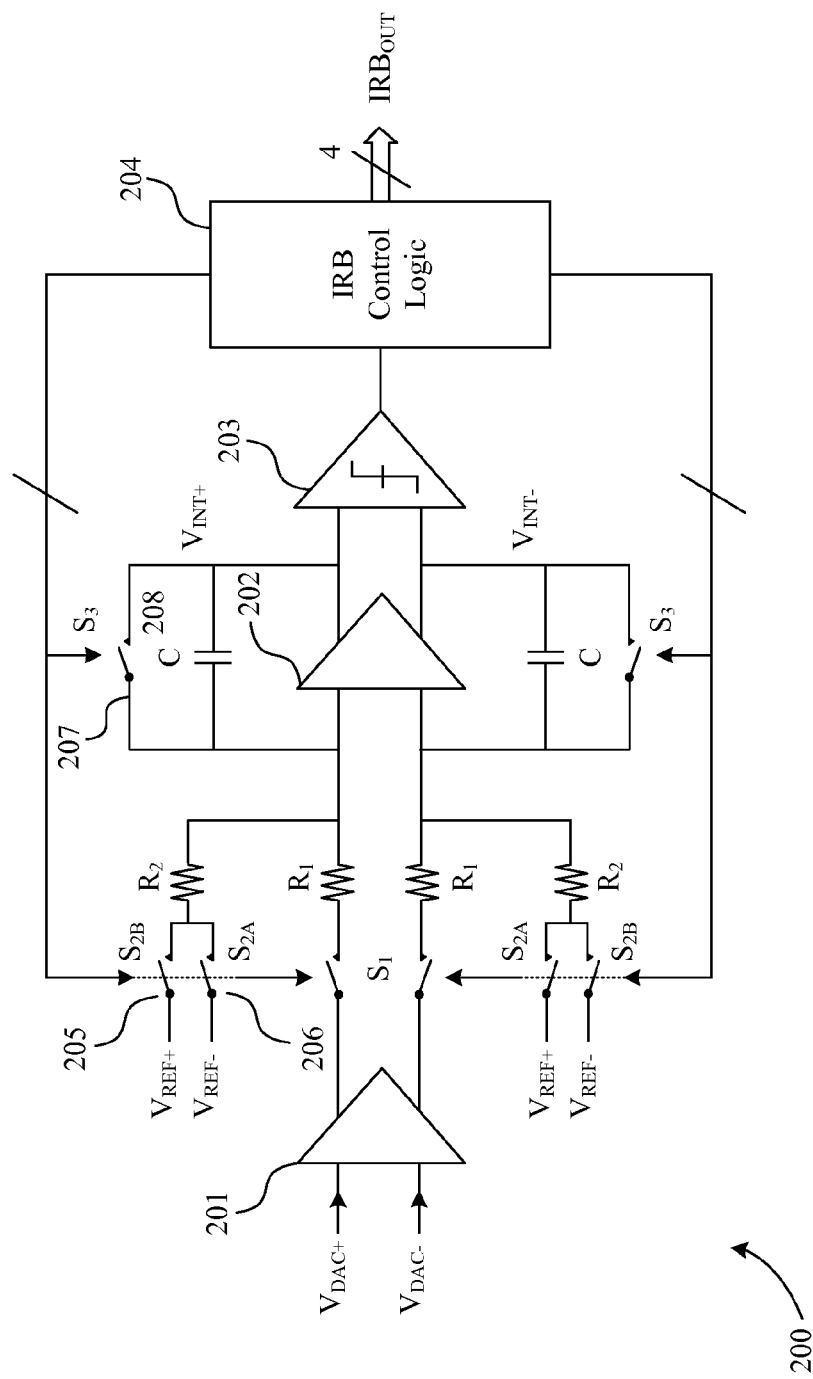

FIG. 2 is a schematic circuit diagram of an example resolution booster that may be utilized in a dual mode analog-to-digital converter, according to an illustrative embodiment of the invention.

Figure 3:
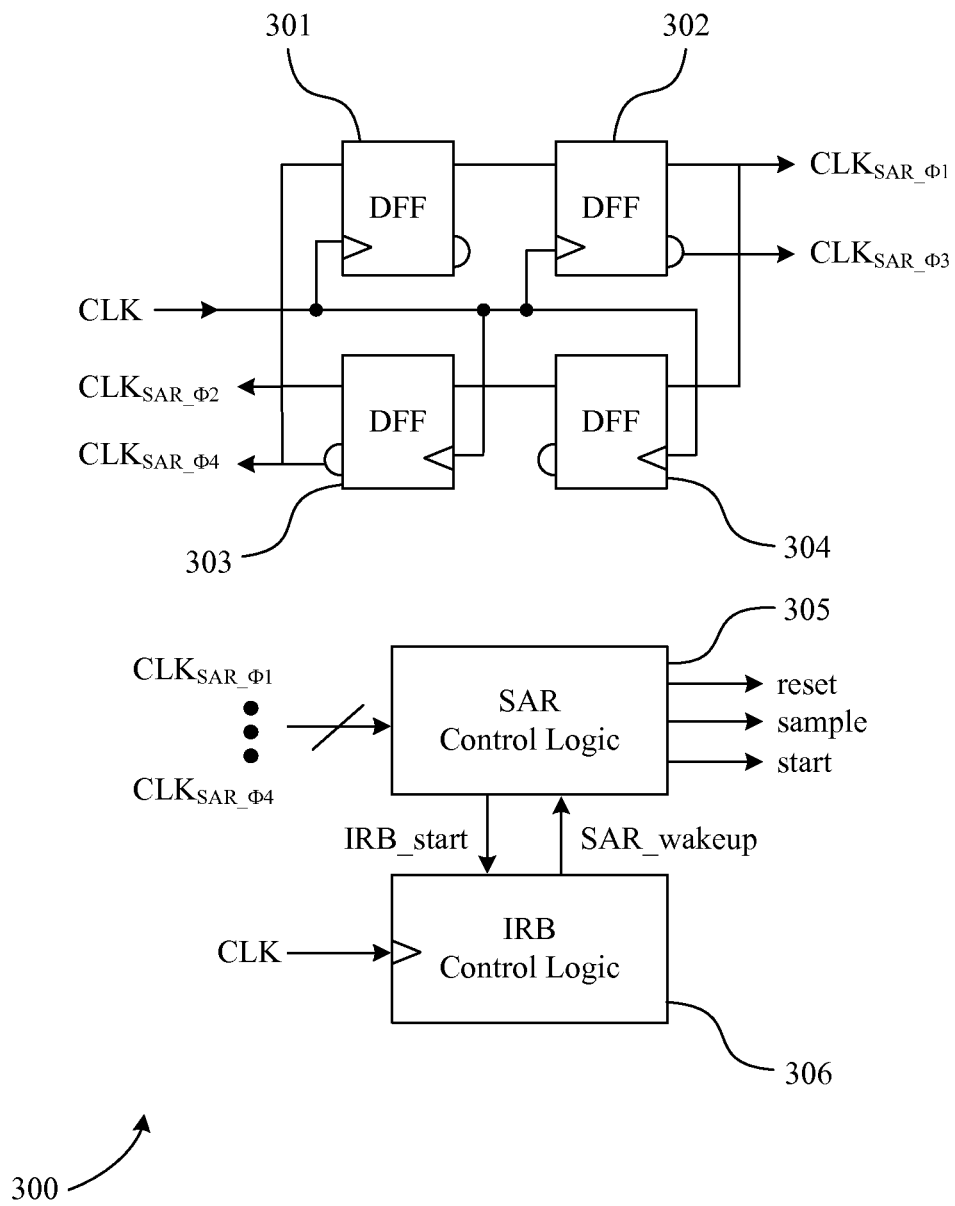

FIG. 3 is a block diagram of a clocking and control scheme that may be utilized in conjunction with a dual mode analog-to-digital converter, according to an illustrative embodiment of the invention.

Figure 4:
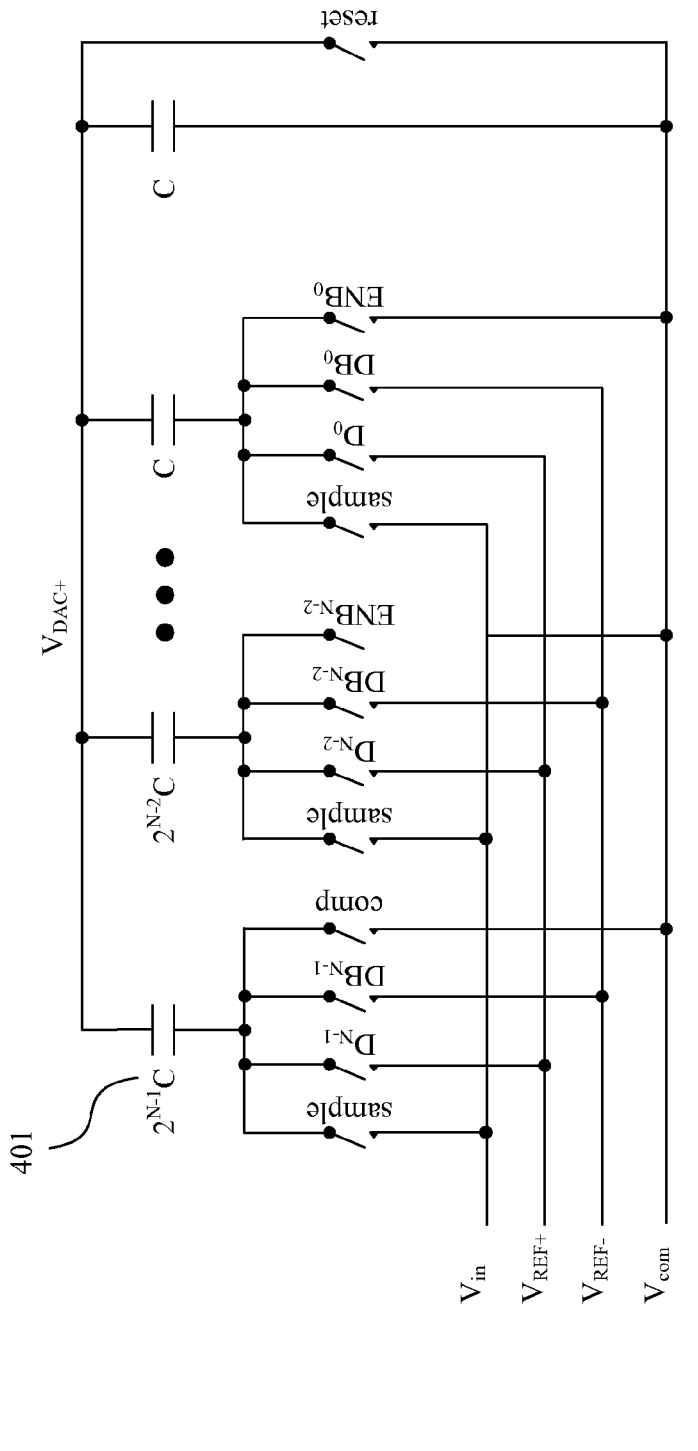

FIG. 4 is a schematic diagram of a capacitive digital-to-analog converter that may be incorporated into a successive approximation analog-to-digital converter, according to an illustrative embodiment of the invention.

Figure 5:
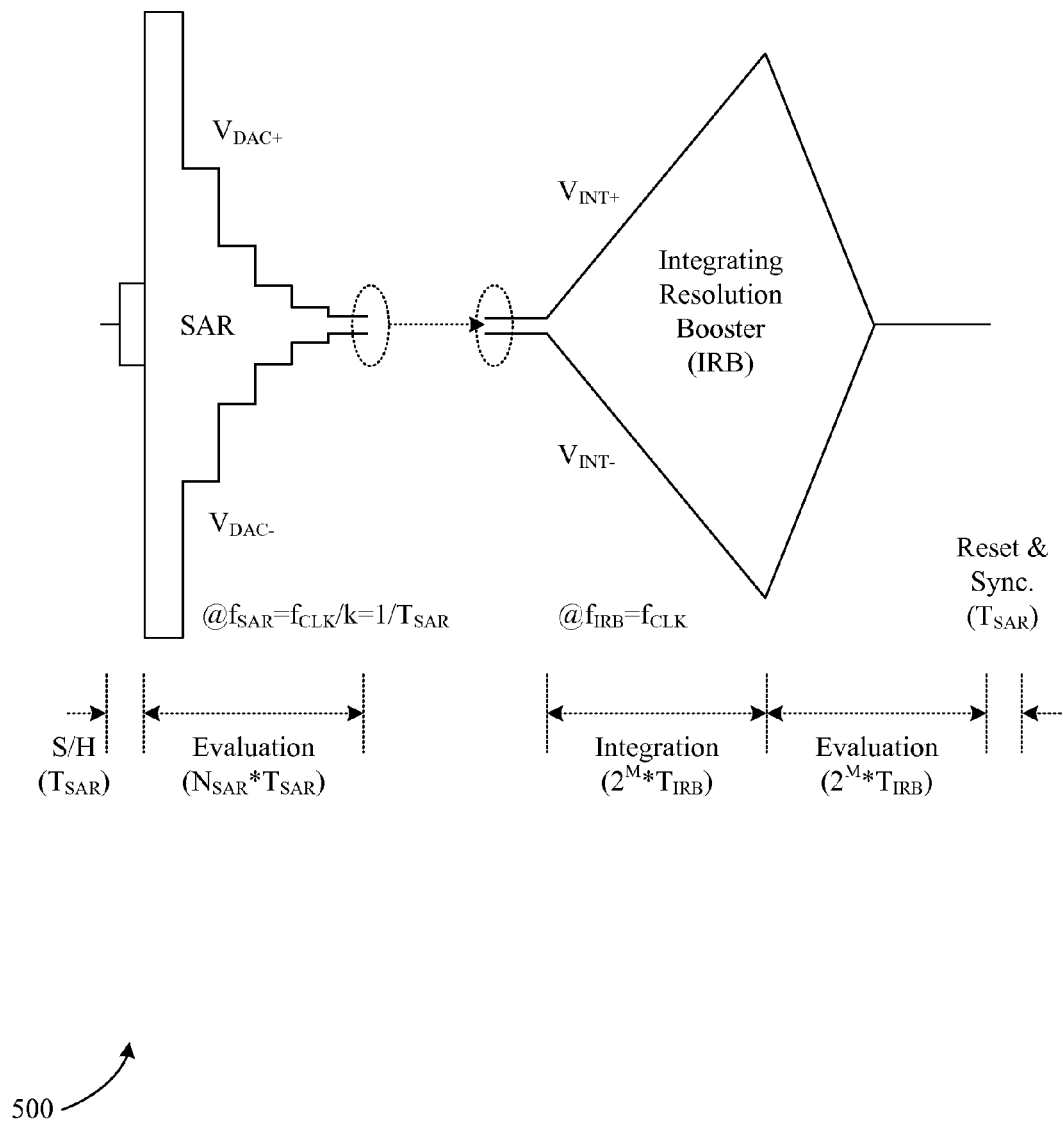

FIG. 5 is an example waveform of the operation of an analog-to-digital converter that may be utilized in various embodiments of the invention.

DETAILED DESCRIPTION OF THE INVENTION

Example embodiments of the invention will now be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

In various embodiments of the invention, a successive-approximation structure may be combined with an integrating structure to form a dual mode analog-to-digital converter ("ADC"). In this regard, a relatively high resolution ADC may be provided that maintains relatively low-power consumption characteristics. In certain embodiments, the integrating structure may begin to operate after the successive-approximation structure has completed its data conversion. In this regard, a relatively higher conversion rate than that normally achieved by an integrating-type ADC (e.g., a rate less than approximately 100 Hertz) may be achieved. In one example embodiment, the integrating structure may be an resolution booster that operates on one or more least significant bits ("LSBs") of the successive approximation structure. Additionally, the resolution booster may be selectively turned on and off as desired. In this regard, power consumption may be limited and a balance between desired resolution and power consumption may be optimized.

According to an aspect of the invention, an ADC may support two modes of operation—a relatively low power mode and a higher resolution mode. In certain embodiments, a dual mode ADC may include a successive approximation analog-to-digital converter ("SAR ADS"), an resolution booster, and an output combiner. A relatively low power mode may be provided by the SAR ADC and the output combiner. The SAR ADC may be implemented as differential circuits to provide improved noise immunity, and the SAR ADC may include, for example, capacitive digital-to-analog converters ("C-DACs"), one or more comparators, and various control logic. In an example operation, the SAR ADC may sample a differential input voltage during a first cycle, and the SAR ADC may perform analog-to-digital conversions for a remaining period of time having a number of cycles approximately equal to a number of resolution bits associated with a successive approximation register ("SAR") of the SAR ADC ("$N_{SAR}$").

During a higher resolution mode, the resolution booster may be activated to provide any number of additional resolution bits. In certain embodiments, the resolution booster may include an integrating analog-to-digital converter and may be referred to as an integrating resolution booster ("IRB"). In one example embodiment, the IRB may begin operation following completion of the SAR conversion cycle is finished, and final outputs of one or more differential C-DACs associated with the SAR ADC may be received as IRB inputs. For a desired number of cycles ("M"), the IRB may integrate differentially with a slope proportional to the input, and then the IRB may begin discharging with a relatively fixed slope. Once the discharge completes, an internal M-bit counter status of the IRB may be latched as the IRB output. Because the discharge time varies depending on its input value, the IRB evaluation period may be designed to be the same as the integration time in order to achieve a relatively consistent overall conversion rate. Finally, the output combiner may convert the IRB output of M bits into voltage information and generate an overall ADC output ("$D_{OUT}$") by combining the IRB output with the SAR output of N bits.

With reference to FIG. 1, one example embodiment of a dual mode analog-to-digital converter 100 is illustrated. The ADC 100 may include, for example, two capacitive digital-to-analog converters ("C-DACs") 101, 102, a comparator 103, SAR control logic 104, an integrating resolution booster ("IRB") 105, and an output combiner 106. As desired, the combination of the C-DACs 101, 102, comparator 103, and the SAR control logic 104 may be referred to as an SAR ADC. During a relatively low power mode, the IRB 105 may be disabled, and conversion may be facilitated by the SAR ADC, which may process $N_{SAR}$ bits. In this regard, the SAR ADC may achieve a relatively low power consumption at the sacrifice of resolution. As desired, the SAR ADC may be configured as differential circuits to provide improved or enhanced noise immunity. During a higher resolution mode, the IRB 105 may be activated or enabled, and the addition of the IRB 105 may increase the resolution of the SAR ADC. For example, the resolution may be increased by a couple of bits at the cost of consuming more power. The outputs of the SAR ADC and the IRB may be combined by the output combiner 106 to obtain a final output of the ADC 100.

FIG. 2 is a schematic circuit diagram of an example resolution booster that may be utilized in a dual mode analog-to-digital converter, according to an illustrative embodiment of the invention. In certain embodiments, the resolution booster illustrated in FIG. 2 may be one example of the IRB 105 illustrated in FIG. 1. With reference to FIG. 2, the IRB 105 may including two operational amplifiers 201, 202, one or more comparators 203, IRB control logic 204, and a plurality of control switches 205, 206, 207. During operation, when switch $S_1$ 205 is closed or turned on, an integrator capacitor C 208 may be charged for $2^M$ cycles with a current that is proportional to the difference between the outputs ($V_{DAC+}$, $V_{BAC-}$) of the C-DACs 101, 102 of the SAR ADC shown in FIG. 1 and the common-mode voltage ($V_{COM}$) of the C-DACs 101, 102. M may be the number of bits processed by the IRB 105. Additionally, the charge current is given by ($V_{DAC}$−$V_{COM}$)/$R_1$. By opening $S_1$ 205 or turning $S_1$ 205 off and closing $S_{2A}/S_{2B}$ 206, an evaluation period may begin. The IRB control logic may measure the discharge time of the integrator, and the measured discharge time may be converted into voltage information in the output combiner 106. The discharge current is given by ($V_{REF}$−$V_{COM}$)/$R_2$. To ensure that the evaluation is able to finish within $2^M * T_{IRB}$, the resistor $R_2$ may be designed to be smaller than the resistor $R_1$. In this regard, the discharge time may become shorter than the charge time. Because polarity change of C-DAC outputs alternates the charging direction through the integrating capacitor, the discharging direction may be automatically switched by choosing $S_{2A}$ or $S_{2B}$ depending on the polarity. In this regard, the integrator output waveform may be in the shape of a triangle as illustrated in FIG. 5, and the amplitude of the output may approximately be calculated utilizing equation (1) below, where $I_{INT}$ may be the charge current amount of the integrator and $T_{INT}$ may be its charge time.

$$V_{INT,MAX} \cong C \cdot I_{INT} \cdot T_{INT} = C \cdot \frac{V_{DAC}}{R_1} \cdot \frac{2^M T_{SAR}}{k} \quad (1)$$

The operation detail of the SAR ADC and the IRB 105 is explained in greater detail below with reference to FIG. 5.

In certain embodiments, the IRB 105 may provide automatic error correction for the SAR ADC. For example, the integrator input range of the IRB 105 may be designed to be greater than the SAR least significant bit ("LSB") voltage, and the M value may be chosen to satisfy a conversion-rate requirement of the overall ADC 100. Additionally, in accordance with equation (1), C and $R_1$ values may be chosen to protect the integrator amplifier from entering the non-linear region.

In certain embodiments of the invention, an internal clock generator may generate clocking signals that are provided to the SAR ADC and the IRB 105. FIG. 3 is a block diagram of a clocking and control scheme that may be utilized in conjunction with a dual mode analog-to-digital converter, according to an illustrative embodiment of the invention. As the number of additional resolution bits (N−$N_{SAR}$) of a higher resolution mode increases, the speed of overall conversion may become slower. As shown in equation (1), the IRB processing time is proportional to $2^M$, and the M value is approximately proportional to N−$N_{SAR}$. In order to relax this degradation problem of the conversion rate, the IRB clock may be designed to have a higher frequency than the SAR clock.

In one example embodiment, a clock generator circuit 300 may utilize a multi-phase frequency divider scheme. For example, a plurality of d flip-flops 301, 302, 303, 304 may divide an external clock frequency into a divided multi-phase clock frequency. The external clock may be assigned to the IRB 105, and the divided clock frequency may be assigned to the SAR.

During a first cycle of the SAR operation in a low-power mode, the SAR may perform a reset function to clear or clean any remaining charge on the C-DACs 101, 102, sample its input signals, and then produce a control signal of "comp" to initiate an SAR conversion during the next cycle. For a relatively reliable construction of these functions, a multi-phase frequency divider may be adopted to internally generate multi-phase SAR clocks as shown in FIG. 3.

During a low-power mode, SAR ADC operation may be established and other circuits, such as the IRB 105, may be disabled. During a higher resolution mode, a more complicated control scheme may be utilized. For example, different clock frequencies may be provided to the SAR ADC and the IRB 105. Additionally, during the operation of one of the SAR ADC and the IRB 105, the other device may be placed in a hold state or turned off. As desired, a time synchronization protocol may be established between the SAR ADC and the IRB 105. As shown in FIG. 3, after a first SAR period, the SAR control logic 305 may send an enable signal of "IRB_start" to the IRB 105 while simultaneously driving each of the SAR circuits into a "hold" status. The IRB 105 may then perform its resolution boosting function. Once the IRB evaluation period ends, the IRB control logic 306 may send a wakeup signal of "SAR_wakeup" to the SAR, and the IRB circuit may be turned off. Finally, the overall ADC 100 may generate final conversion outputs. For example, the output combiner 106 may combine the outputs of the SAR ADC and the IRB 105. The ADC 100 may then enter a "reset" status for one or more SAR-clock cycles to prepare for a subsequent conversion.

FIG. 4 is a schematic diagram of a capacitive digital-to-analog converter 400 that may be incorporated into the SAR ADC, according to an illustrative embodiment of the invention. As shown in FIG. 1, a differential SAR ADC may utilize a pair of C-DACs 101, 102 which perform both digital-to-analog conversion and an input sampling function. FIG. 4 illustrates a half circuit of the C-DAC pair 101, 102. The C-DAC 400 may include a capacitor array that is charged and discharged to facilitate sampling and conversion of an input signal.

In one example operation, during a first SAR cycle, control signals (e.g., "reset," "sample," and "comp") may be generated as described in greater detail above with reference to FIG. 3. In certain embodiments, the control signals may be generated to be non-overlapping signals. For example, a multi-phase clock, such as a four-phase clock, may be utilized to generate various clock signals ($CLK_{SAR\_\phi1-4}$), and the clock signals may be utilized to control the C-DAC 101. During the first phase of the first SAR clock cycle, the "reset" signal may clean or clear the charge on the C-DACs 101, 102. During the second and third phases, the "sample" signal may sample input signals onto the C-DAC capacitors. During a final phase, the "start" signal may direct both the SAR control logic and the C-DAC pair 101, 102 to prepare its most significant bit ("MSB") evaluation. Comparisons may be performed for the other bits in a similar manner to complete a conversion.

FIG. 5 is an example waveform 500 of the operation of an analog-to-digital converter that may be utilized in various embodiments of the invention, such as the ADC 100 illustrated in FIG. 1. For a given period, an SAR ADC may sample an input signal to generate an $N_{SAR}$ bit digitized code. An Integrating ADC may be capable of achieving higher resolution due to the inherent immunity to the component variation on the process while other ADC architectures suffer degradation in achievable resolution due to the component variation. In order to improve the resolution of the SAR ADC and overall ADC architecture, an IRB 105 may accepts one or more LSBs of the SAR ADC as an input, and the IRB 105 may perform additional analog to digital conversion. The output of SAR ADC and IRB 105 may then be combined together to generate a total N bit of digitized code.

In certain embodiments, a subsidiary benefit of utilizing an IRB 105 is the capability of performing automatic error correction against probable SAR conversion errors. If the input range of the IRB 105 is designed to be greater that the LSB voltage of the SAR, then the IRB 105 may recover the SAR conversion errors that might occur during its previous SAR period. However, there is a trade-off between this error-correction coverage and the overall conversion time. Larger correction coverage may makes the IRB period longer than necessary. The overall conversion time may be given by equation (2) below, where k is the ratio of the IRB clock frequency to the SAR clock frequency and TSAR is the period of the SAR clock.

$$\text{Conversion Time} = \left(2 + N_{SAR} + \frac{2^{M+1}}{k}\right) \cdot T_{SAR} \quad (2)$$

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A dual mode analog-to-digital converter, comprising:
a successive approximation analog-to-digital converter configured to convert an analog signal into digital data;
a resolution booster that is selectively activated to enhance the resolution of the successive approximation analog-to-digital converter;
a clock generator configured to generate a first clock signal for the successive approximation analog-to-digital converter and a second clock signal for the resolution booster, wherein the first clock signal has a first frequency and the second clock signal has a second frequency higher than the first frequency; and
an output combiner configured to combine the respective outputs of the successive approximation analog-to-digital converter and the resolution booster.

2. The system of claim 1, wherein the successive approximation analog-to-digital converter comprises a pair of capacitive digital-to-analog converters configured to provide digital-to-analog conversion and input sampling.

3. The system of claim 2, wherein respective outputs of the pair of capacitive digital-to-analog converters are provided as inputs to the resolution booster component.

4. The system of claim 1, wherein the resolution booster comprises an integrating analog-to-digital converter.

5. The system of claim 4, wherein a least significant bit of an output of the successive approximation analog-to-digital converter is provided as an input to the integrating analog-to digital converter.

6. The system of claim 4, wherein an integrator input range for the resolution booster is greater than a least significant bit voltage for the successive approximation analog-to-digital converter.

7. The system of claim 1, wherein the resolution booster is not activated during a low power mode of operation.

8. The system of claim 1, wherein the first clock signal comprises a divided multi-phase clock frequency that is provided to the successive approximation analog-to-digital converter.

9. A method for a dual mode analog-to-digital converter, comprising:
providing an analog signal to a successive approximation analog-to-digital converter to convert the analog signal into digital data;
selectively activating a resolution booster to enhance the resolution of the successive approximation analog-to-digital converter;
providing a clock generator configured to generate a first clock signal for the successive approximation analog-to-digital converter and a second clock signal for the resolution booster, wherein the first clock signal has a first frequency and the second clock signal has a second frequency higher than the first frequency; and combining the respective outputs of the successive approximation analog-to-digital converter and the resolution booster with an output combiner.

10. The method of claim 9, wherein providing the analog signal to a successive approximation analog-to-digital converter comprises providing the analog signal to a successive approximation analog-to-digital converter comprising a pair of capacitive digital-to-analog converters configured to provide digital-to-analog conversion and input sampling.

11. The method of claim 10, further comprising:

providing respective outputs of the pair of capacitive digital-to-analog converters as inputs to the resolution booster component.

12. The system of claim 9, wherein selectively activating a resolution booster comprises selectively activating an integrating analog-to-digital converter.

13. The method of claim 12, further comprising:

providing a least significant bit of an output of the successive approximation analog-to-digital converter as an input to the integrating analog-to digital converter.

14. The method of claim 12, wherein selectively activating an integrating analog-to-digital converter comprises selectively activating an integrating analog-to-digital converter having an integrator input range greater than a least significant bit voltage for the successive approximation analog-to-digital converter.

15. The method of claim 9, wherein the resolution booster is not activated during a low power mode of operation.

16. The method of claim 9, wherein the first clock signal comprises a divided multi-phase clock frequency that is provided to the successive approximation analog-to-digital converter.

* * * * *